United States Patent
Morita et al.

(10) Patent No.: US 11,685,993 B2
(45) Date of Patent: Jun. 27, 2023

(54) METHOD OF CLEANING REACTION TUBE, METHOD OF MANUFACTURING SEMICONDUCTOR DEVICE, AND SUBSTRATE PROCESSING APPARATUS

(71) Applicants: KOKUSAI ELECTRIC CORPORATION, Tokyo (JP); SHIN-ETSU QUARTZ PRODUCTS CO., LTD., Tokyo (JP)

(72) Inventors: Shinya Morita, Toyama (JP); Toru Nakada, Toyama (JP); Hiroyuki Kimura, Tokyo (JP); Toru Segawa, Fukushima (JP)

(73) Assignees: KOKUSAI ELECTRIC CORPORATION, Tokyo (JP); SHIN-ETSU QUARTZ PRODUCTS CO., LTD., Tokyo (JP)

( * ) Notice: Subject to any disclaimer, the term of this patent is extended or adjusted under 35 U.S.C. 154(b) by 0 days.

(21) Appl. No.: 17/155,877

(22) Filed: Jan. 22, 2021

(65) Prior Publication Data
US 2021/0230745 A1    Jul. 29, 2021

(30) Foreign Application Priority Data
Jan. 23, 2020  (JP) .............................. JP2020-009396

(51) Int. Cl.
*B08B 3/08* (2006.01)
*C23C 16/44* (2006.01)
(Continued)

(52) U.S. Cl.
CPC ............ *C23C 16/4407* (2013.01); *B08B 3/08* (2013.01); *B08B 3/10* (2013.01); *B08B 9/032* (2013.01);
(Continued)

(58) Field of Classification Search
CPC .............. C23C 16/4407; C23C 16/345; C23C 16/45525; B08B 3/08; B08B 3/10; B08B 9/032; H01L 21/0217; H01L 21/0228
See application file for complete search history.

(56) References Cited

U.S. PATENT DOCUMENTS 10,707,074 B2 * 7/2020 Nagatomi ......... H01L 21/02181
2005/0245099 A1  11/2005 Endo et al.
(Continued)

FOREIGN PATENT DOCUMENTS

CN  101359581 A  2/2009
JP  H11-219925 A  8/1999
(Continued)

OTHER PUBLICATIONS

Machine Translations of JPH11219925A (Year: 1999).*
(Continued)

*Primary Examiner* — Sharidan Carrillo
(74) *Attorney, Agent, or Firm* — Volpe Koenig

(57) ABSTRACT

There is provided a technique that includes a first annealing step of annealing the reaction tube; a first cleaning step of cleaning an inner surface of the reaction tube, after the first annealing step, with a liquid including a fluorine compound having a first concentration; a first rinsing step of washing away the fluorine compound used in the first cleaning step with pure water; a second annealing step of annealing the reaction tube; a second cleaning step of cleaning the inner surface of the reaction tube, after the second annealing step, with a liquid including a fluorine compound having a second concentration higher than the first concentration; and a second rinsing step of washing away the fluorine compound used in the second cleaning step with pure water.

9 Claims, 4 Drawing Sheets

(51) Int. Cl.
  *B08B 3/10* (2006.01)
  *H01L 21/02* (2006.01)
  *C23C 16/34* (2006.01)
  *C23C 16/455* (2006.01)
  *B08B 9/032* (2006.01)

(52) U.S. Cl.
  CPC ...... *C23C 16/345* (2013.01); *C23C 16/45525* (2013.01); *H01L 21/0217* (2013.01); *H01L 21/0228* (2013.01)

(56) References Cited

U.S. PATENT DOCUMENTS

| | | | | |
|---|---|---|---|---|
| 2014/0179085 A1* | 6/2014 | Hirose | .............. | H01L 21/02532 |
| | | | | 118/715 |
| 2015/0000695 A1* | 1/2015 | Noda | ................ | H01L 21/02126 |
| | | | | 134/4 |
| 2015/0031216 A1 | 1/2015 | Akae et al. | | |
| 2017/0260626 A1* | 9/2017 | Nagato | .............. | H01L 21/02164 |
| 2021/0230745 A1* | 7/2021 | Morita | .............. | C23C 16/45546 |

FOREIGN PATENT DOCUMENTS

| | | |
|---|---|---|
| JP | 2009-027104 A | 2/2009 |
| JP | 2009-289960 A | 12/2009 |
| JP | 2015-026660 A | 2/2015 |
| TW | 200604390 A | 2/2006 |

OTHER PUBLICATIONS

Machine Translations of CN101359581A (Year: 2009).*
Taiwanese Office Action dated Aug. 18, 2021 for Taiwanese Patent Application No. 109146216.
Chinese Office Action dated Jun. 1, 2022 for Chinese Patent Application No. 202110084725.3.
Korean Office Action dated Oct. 24, 2022 for Korean Patent Application No. 10-2021-0009281.

* cited by examiner

METHOD OF CLEANING REACTION TUBE, METHOD OF MANUFACTURING SEMICONDUCTOR DEVICE, AND SUBSTRATE PROCESSING APPARATUS

CROSS-REFERENCE TO RELATED APPLICATION

This application is based upon and claims the benefit of priority from Japanese Patent Application No. 2020-009396, filed on Jan. 23, 2020, the entire contents of which are incorporated herein by reference.

TECHNICAL FIELD

The present disclosure relates to a method of cleaning a reaction tube, a method of manufacturing a semiconductor device, and a substrate processing apparatus.

BACKGROUND

A related art discloses a method of cleaning a heat-resistant semiconductor-manufacturing jig, in which the heat-resistant semiconductor-manufacturing jig using a porous sintered body is cleaned with a chemical solution and then is rinsed with pure water, steam, or other rinsing medium and a pressurizing force is applied to the chemical solution or the rinsing medium to extrude and clean the heat-resistant jig from one side space to the other side space thereof.

SUMMARY

A reaction tube used for manufacturing semiconductor devices is cleaned with a chemical solution including a fluorine compound and then is rinsed with pure water.

However, if the rinsing process is insufficient, the fluorine compound remaining on an inner surface of the reaction tube reacts with a cleaning gas, a processing gas, or the like used when manufacturing the semiconductor devices, and the reaction tube itself may be damaged.

Some embodiments of the present disclosure provide a technique for suppressing the residue of a fluorine compound from remaining on the inner surface of a reaction tube even after the reaction tube is cleaned with a chemical solution including the fluorine compound.

According to one or more embodiments of the present disclosure, there is provided a technique that includes a first annealing step of annealing the reaction tube; a first cleaning step of cleaning an inner surface of the reaction tube, after the first annealing step, with a liquid including a fluorine compound having a first concentration; a first rinsing step of washing away the fluorine compound used in the first cleaning step with pure water, wherein performing the first rinsing step one or more times is set to be a first cycle, and the first cycle is performed one or more times; a second annealing step of annealing the reaction tube; a second cleaning step of cleaning the inner surface of the reaction tube, after the second annealing step, with a liquid including a fluorine compound having a second concentration higher than the first concentration; and a second rinsing step of washing away the fluorine compound used in the second cleaning step with pure water, wherein the second rinsing step is performed two or more times.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
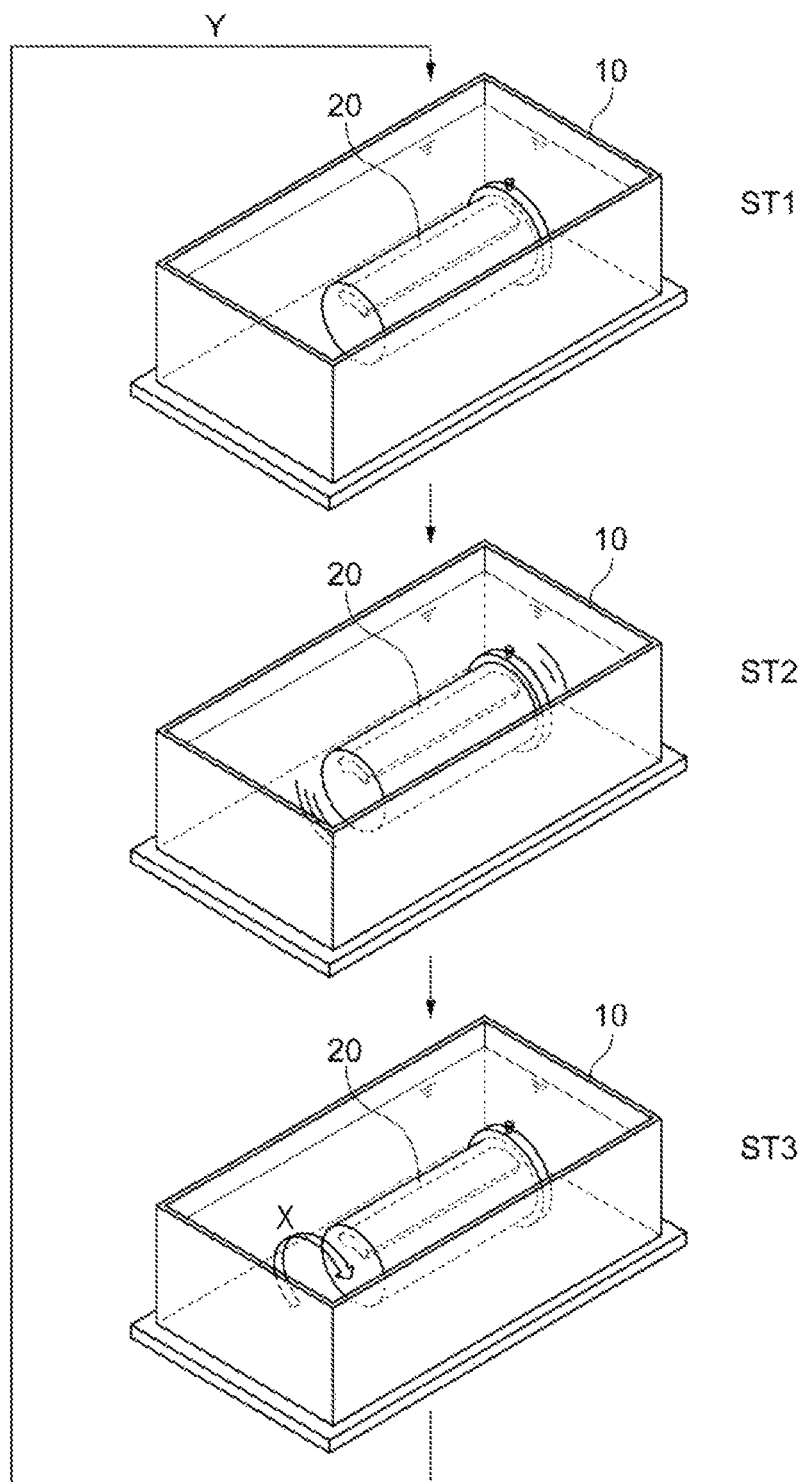
FIG. 1 is a view for explaining a rinsing step used in a method of cleaning a reaction tube, according to one or more embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A method of cleaning a reaction tube, a method of manufacturing a semiconductor device, and a substrate processing apparatus according to one or more embodiments of the present disclosure will be described with reference to FIGS. 1 to 4.

Note that the numerical range represented by using "to" in the present disclosure means a range including numerical values before and after "to" as the lower limit value and the upper limit value.

<Method of Cleaning Reaction Tube>

In the method of cleaning a reaction tube according to the present embodiments, a reaction tube after annealing is subjected to one cycle including a first cleaning step of cleaning the inner surface of the reaction tube with a liquid including a low-concentration fluorine compound and a first rinsing step of washing the fluorine compound away with pure water in order to increase the removability of deposits and impurities (particularly metal-containing deposits and impurities) occurred in a manufacturing process and a processing process of the reaction tube. Then, after a second annealing step, a second cleaning step of cleaning the inner surface of the reaction tube with a liquid including a high-concentration fluorine compound is performed to remove deposits and impurities that could not be completely removed even after one cycle, and a second rinsing step is performed two or more times to sufficiently remove the fluorine compound remaining in an inner portion of the reaction tube.

The reaction tube may be, for example, a "quartz reaction tube," and thereafter, the quartz reaction tube may be simply referred to as a "reaction tube."

Here, hydrogen fluoride (HF) is often used as the fluorine compound, and when this hydrogen fluoride remains in the inner portion of the quartz reaction tube, it reacts with $SiO_2$ constituting the quartz reaction tube to erode the quartz reaction tube and produce precipitates such as hexafluorosilicic acid dihydrate ($H_2SiF_6 \cdot 2H_2O$).

In particular, if there are many hydroxyl groups in the quartz reaction tube, the hydroxyl groups react with the precipitates (hexafluorosilicic acid dihydrate) over time or with heating, and are replaced with fluorine atoms. As a result, fluorine atoms are introduced into the surface layer of the inner surface of the quartz reaction tube.

The fluorine atoms introduced into the surface layer may then cause a further chemical reaction with a component such as a gas supplied into the interior of the quartz reaction tube or a component of the quartz reaction tube to gasify the fluorine compound. This gasified fluorine compound further erodes the quartz reaction tube and in addition, increases the partial pressure of the already eroded portion. As a result, the eroded portion of the quartz reaction tube is further eroded and becomes larger, and damage to the quartz reaction tube increases, which may result in shortening of the life span of the quartz reaction tube.

In view of the above, the present discloser has developed a technique for cleaning a reaction tube, which is capable of suppressing the residue of a fluorine compound from remaining on the inner surface of a reaction tube even if cleaning is performed with a chemical solution including the fluorine compound.

The technique for cleaning a reaction tube according to the present embodiments includes: a first annealing step of annealing a reaction tube at a high temperature (for example, 1,000 degrees C. to 1,200 degrees C.); a first cleaning step of cleaning the inner surface of the reaction tube, after the first annealing step, with a liquid including a fluorine compound having a low concentration (for example, 2% by mass to 5% by mass); a first rinsing step of washing away the fluorine compound used in the first cleaning step with pure water, wherein performing the first rinsing step one or more times (specifically two or more times) is set to be a cycle, and the cycle is performed one or more times; and then a second annealing step of annealing the reaction tube at a high temperature (for example, 1,000 degrees C. to 1,200 degrees C.); a second cleaning step of cleaning the inner surface of the reaction tube, after the second annealing step, with a liquid including a fluorine compound having a high concentration (for example, 10% by mass to 50% by mass); and a second rinsing step of washing away the fluorine compound used in the second cleaning step with pure water are performed in which the second rinsing step is performed two or more times.

According to the technique of cleaning the reaction tube according to the present embodiments, it has been found that after removing deposits on the quartz reaction tube, impurities introduced in the inner surface layer of the quartz reaction tube, and the like, the residue of the fluorine compound remaining on the inner surface of the quartz reaction tube was suppressed.

Hereinafter, each step in a method of cleaning a reaction tube according to the present embodiments will be described.

[First Annealing Step]

The first annealing step is a step of annealing the reaction tube. The annealing temperature is, for example, 1,000 degrees C. to 1,200 degrees C.

Here, the reaction tube provided for the first annealing step may include a buffer chamber for accommodating at least one selected from the group of a high-frequency electrode and a gas nozzle in the reaction tube, in which the gas nozzle may be provided separately from the buffer chamber.

By this first annealing step, a strain remaining during production of the reaction tube can be removed to the extent that it is not damaged with the first cleaning step.

As long as the annealing (heat treatment) at the above temperature is possible, a method for annealing the reaction tube is not limited, and a known method for annealing a quartz reaction tube can be applied.

From the viewpoint of preventing a cross section of the reaction tube from being flattened due to heat and its own weight during the annealing process, the annealing of the reaction tube may be performed with the reaction tube set to be vertical (that is, with an axial direction of the reaction tube set to be parallel to a direction of gravity).

As described above, the annealing temperature is specifically 1,000 degrees C. to 1,200 degrees C., more specifically 1,050 degrees C. to 1,150 degrees C. After the keep time at the annealing temperature, the annealing temperature is more specifically decreased slowly to 900 degrees C.

The annealing time is kept at the annealing temperature, specifically for 15 minutes to 5 hours, more specifically for 30 minutes to 2 hours. The slow-cooling time after keeping at the annealing temperature is more specifically 1 hour to 3 hours.

Further, the first annealing step may be performed in an oxidizing atmosphere containing oxygen rather than an inert gas atmosphere in order to vaporize, decompose, or stabilize the surface residual substance by oxidation.

[First Cleaning Step]

The first cleaning step is a step of cleaning the inner surface of the reaction tube, after the first annealing step, with a liquid containing a fluorine compound having a first concentration.

By this first cleaning step, cleaning of the inner surface of the reaction tube (mainly removal of deposits and impurities (particularly metal-containing deposits and impurities) occurred in a manufacturing process and a processing process of the reaction tube) is performed.

Examples of the cleaning in the first cleaning step may include a method of immersing the reaction tube in a liquid including a fluorine compound, a method of flushing a liquid including a fluorine compound by a shower or the like, etc.

An aqueous solution of hydrogen fluoride (HF) (hydrofluoric acid), nitrohydrofluoric acid which is a mixed aqueous solution of hydrogen fluoride (HF) and nitric acid ($HNO_3$), and the like may be used as the liquid including a fluorine compound used in the first cleaning step. By using the hydrofluoric acid or nitrohydrofluoric acid, the surface of the inner surface of the reaction tube can be etched, and the above-mentioned deposits and impurities can be easily removed.

The concentration (that is, the first concentration) of the fluorine compound in the liquid including the fluorine compound may be 2% by mass to 6% by mass, specifically 2% by mass to 5% by mass, more specifically 4% by mass to 5% by mass.

The contact time (that is, cleaning time) of the liquid including the fluorine compound to the reaction tube may be 10 seconds to 6 hours, specifically 5 minutes to 2 hours, more specifically 10 minutes to 1 hour.

[First Rinsing Step]

The first rinsing step is a step of washing away the fluorine compound used in the first cleaning step with pure water.

This first rinsing step suppresses the fluorine compound used in the first cleaning step from remaining on the inner surface of the reaction tube.

In the first rinsing step, a method of washing away the fluorine compound with pure water is not particularly limited, and may include a method of bringing pure water into contact with the inner surface of the reaction tube such as a method of washing away the inner surface of the reaction tube with running water, a method of immersing the reaction tube in pure water for cleaning, and the like.

From the viewpoint of the removability and the high removal efficiency of the fluorine compound, the first rinsing step may include a wetting step of wetting the reaction tube by contacting it with pure water, a rocking step of rocking the reaction tube in contact with pure water, and a rotating step of rotating the reaction tube in contact with pure water in the circumferential direction of the reaction tube.

As the wetting step, the reaction tube may be immersed in pure water, or the pure water may be flushed over the entire reaction tube to wet the surface of the reaction tube.

As the rocking step, the reaction tube may be rocked while immersing the reaction tube in pure water or while flushing the pure water over the entire reaction tube.

As the rotating step, the reaction tube may be rotated while immersing the reaction tube in pure water or while flushing the pure water over the entire reaction tube.

Hereinafter, the rinsing step including the wetting step, the rocking step, and the rotating step is also referred to as a "specific rinsing step."

The specific rinsing step will be described with reference to FIG. 1. FIG. 1 is a process diagram showing an example of the specific rinsing step.

First, pure water is put into a container 10, and the reaction tube 20 lies down (that is, with the axial direction of the reaction tube parallel to a water surface) and is immersed in the pure water (ST1: wetting step).

After that, the reaction tube 20 immersed in the pure water is rocked up, down, left, and right for, for example, 30 seconds (ST2: rocking step).

Subsequently, the reaction tube 20 immersed in the pure water is rotated in the circumferential direction (arrow X direction in FIG. 1) of the reaction tube for, for example, 5 minutes (ST3: rotating step).

The temperature of the pure water used in the wetting step may be 10 degrees C. to 50 degrees C., and entire step of this specific rinsing step may be performed with the pure water in this temperature range.

In the rocking step, the time required for rocking the reaction tube may be 10 seconds to 300 seconds, specifically 30 seconds to 180 seconds.

In the rotating step, the time required for rotating the reaction tube may be 1 minute to 20 minutes, specifically 3 minutes to 10 minutes.

The pure water may be passed from an opening of the reaction tube to the inner portion thereof during the wetting step, the rocking step, and the rotating step.

The reaction tube applied to the method of cleaning the reaction tube according to the present embodiments may include a buffer chamber formed therein, or a buffer chamber and a gas nozzle formed therein. A fluorine compound tends to remain at end portions of the buffer chamber and the gas nozzle.

By going through the specific rinsing step shown in FIG. 1 (that is, the rinsing step including the wetting step, the rocking step, and the rotating step), it is possible to effectively remove the fluorine compound remaining at the end portions of the buffer chamber and the gas nozzle.

More specifically, by wetting the entire surface with the pure water and rocking the reaction tube while bringing the surface into contact with the pure water, it is possible to effectively remove the fluorine compound remaining at the end portions of the buffer chamber and the gas nozzle.

Further, by wetting the entire surface with the pure water and rotating the reaction tube in the circumferential direction thereof while bringing the surface into contact with the pure water, it is possible to effectively remove the fluorine compound remaining at the inner surface of the reaction tube.

When the wetting step, the rocking step, and the rotating step are set as one cycle (which may be referred to as a first cycle), the above-described specific rinsing step may be performed by performing this one cycle one or more times, specifically two or more times. That is, in the specific rinsing step shown in FIG. 1, as indicated by an arrow Y, after the rotating step indicated by ST3 is completed, the process may return to the wetting step indicated by ST1, and the next cycle of the specific rinsing step is started.

When the above-mentioned one cycle is repeated two or more times, the pure water used may be the same or different. That is, the next cycle after the end of the one cycle may be performed by using new pure water.

Further, instead of immersing the reaction tube in the pure water as described above, for example, the pure water may be flushed through a hose for cleaning. In that case, the reaction tube may be rocked or rotated while flushing the pure water.

In the method of cleaning the reaction tube according to the present embodiments, one cycle (which may be referred to as a second cycle) including the above-mentioned first annealing step, first cleaning step, and first rinsing step may be performed one or more times, specifically two or more times.

Since the concentration of the fluorine compound in the first cleaning step is low, this cycle may be performed a plurality of times in order to increase the cleaning performance of the reaction tube.

On the other hand, the upper limit of the number of cycles may be 20 from the viewpoint of the extension of the time required for the steps and the risk that the inner surface of the reaction tube is roughened.

[Second Annealing Step]

The first annealing step, the first cleaning step, and the first rinsing step (which may be performed one or more times, specifically two or more times) are set as one cycle, and a second annealing step is performed after this one cycle is performed once or a plurality of times.

The second annealing step is a step of annealing the reaction tube at, for example, 1,000 degrees C. to 1,200 degrees C.

By this second annealing step, the strain of the reaction tube can be finally removed.

The details of the second annealing step are the same as those of the above-described first annealing step, preferred aspects thereof are also the same, and therefore, explanation thereof will not be repeated.

[Second Cleaning Step]

A second cleaning step is a step of cleaning the inner surface of the reaction tube, after the second annealing step with a liquid including a fluorine compound having a second concentration higher than the first concentration.

By this second cleaning step, a surface layer of the inner surface of the reaction tube is removed and cleaned (mainly, deposits occurred in a manufacturing process and a processing process of the reaction tube and impurities introduced in the surface layer (particularly, metal element-containing deposits and impurities) are removed).

In particular, since the concentration of the fluorine compound is high, it easily reacts with metal elements, the surface layer of a quartz reaction tube is quickly removed, and thus it is excellent in removing deposits containing metal elements and impurities introduced in the surface layer.

The concentration (that is, the second concentration) of the fluorine compound in the liquid including the fluorine compound may be 10% by mass to 50% by mass, specifically 10% by mass to 30% by mass, more specifically 10% by mass to 20% by mass.

The details of the second cleaning step are the same as those of the above-described first cleaning step except for the concentration of the fluorine compound, and preferred aspects thereof are also the same, and therefore, explanation thereof will not be repeated.

[Second Rinsing Step]

A second rinsing step is a step of washing away the fluorine compound used in the second cleaning step with pure water, which is performed two or more times.

By performing this second rinsing step two or more times, it is possible to prevent the fluorine compound used in the second cleaning step from remaining on the inner surface of the reaction tube.

In the second rinsing step, a method of washing away the fluorine compound with the pure water is not particularly limited, and the method described in the first rinsing step can be used. The specific rinsing step also in the second rinsing step may be used from the viewpoint of the removability and the high removal efficiency of the fluorine compound.

When the specific rinsing step is used for the second rinsing step, this specific rinsing step (that is, the specific rinsing step in which the wetting step, the rocking step, and the rotating step are set as one cycle) may be repeated equal to or more than the number of times of first rinsing step. In particular, in order to increase the effect of removing the fluorine compound, the number of times of specific rinsing steps may be 7 or more, and specifically 10 or more. Further, although there is no limit to the upper limit of the number of times of specific rinsing steps, the upper limit may be equal to or less than 15 times because the time required for the specific rinsing step becomes long.

Further, the rocking step and the rotating step in the specific rinsing step are performed while flushing pure water, and when one cycle is repeated two or more times, the pure water used may be the same or different. That is, the next cycle after the end of one cycle may be performed by using new pure water.

The specific rinsing step used in the second rinsing step may be a method of immersing in the pure water in the same manner as the above-described first rinsing step, but may employ a method of flushing the pure water with, for example, a hose or the like. This is because a portion corresponding to an electrode or a supply nozzle can be reliably in contact with the pure water and washed away since the reaction tube is cleaned with the fluorine compound having a high-concentration, in the second cleaning step. In the specific rinsing step, after rinsing as in the first rinsing step, the pure water may be flushed for further rinsing.

By going through each of the above steps, a reaction tube in which residual fluorine compounds in the inner portion and impurities introduced in the inner surface layer are suppressed can be obtained.

The residual amount of fluorine atoms (F) in the inner portion of the obtained reaction tube can be achieved to be 0.05 $mg/cm^2$ or less (more specifically 0.01 $mg/cm^2$ or less) per unit area of the inner portion. The smaller the residual amount of fluorine atoms (F), the better, but up to about 0.5 $mg/cm^2$ is within the permissible range in actual use even if the fluorine atoms (F) remain.

Here, the residual amount of fluorine atoms (F) in the inner portion of the reaction tube is determined by cleaning the inner surface of the reaction tube with pure water and measuring the amount of fluorine ions contained in the pure water after cleaning by using an ion electrode method, a titration method, or the like. The residual amount of fluorine atoms (F) can be obtained by dividing the measured amount of fluorine ions by the surface area calculated from the inner dimensions of the cleaned inner portion.

The amount of impurities introduced in the inner surface layer of the reaction tube can be determined by dissolving a part of the inner portion of the reaction tube with hydrofluoric acid having high purity to a certain depth and measuring the amount of impurities dissolved in the hydrofluoric acid by using an ICPMS (Inductively Coupled Plasma Mass Spectrometry) or the like. Here, the Na concentration at a depth of 5um of the inner surface layer can be used as an index for the impurities introduced in the inner portion of the reaction tube.

<Substrate Processing Method and Substrate Processing Apparatus>

A substrate processing method according to the present embodiments includes the above-described cleaning step of cleaning the reaction tube by the method of cleaning the reaction tube according to the present embodiments and a substrate-processing step of processing a substrate, in which the reaction tube after the cleaning step is installed in a process furnace and the substrate is accommodated in a process chamber provided inside the cleaned reaction tube.

Further, a substrate processing apparatus according to the present embodiments includes a reaction tube that is cleaned by the method of cleaning the reaction tube according to the present embodiments and configured to be able to install an electrode and a gas supply nozzle, a process chamber that is provided inside the reaction tube and accommodates a substrate holder holding a plurality of substrates, a heater configured to heat the process chamber, a precursor gas supply system configured to supply a precursor gas forming a first layer to the substrates, a reaction gas supply system configured to supply a reaction gas forming a second layer by modifying the first layer, and a controller configured to control the heater, the precursor gas supply system, and the reaction gas supply system so as to process the substrates by supplying the precursor gas and the reaction gas while maintaining the temperature of the substrates accommodated in the process chamber within a predetermined temperature range.

Figure 2:
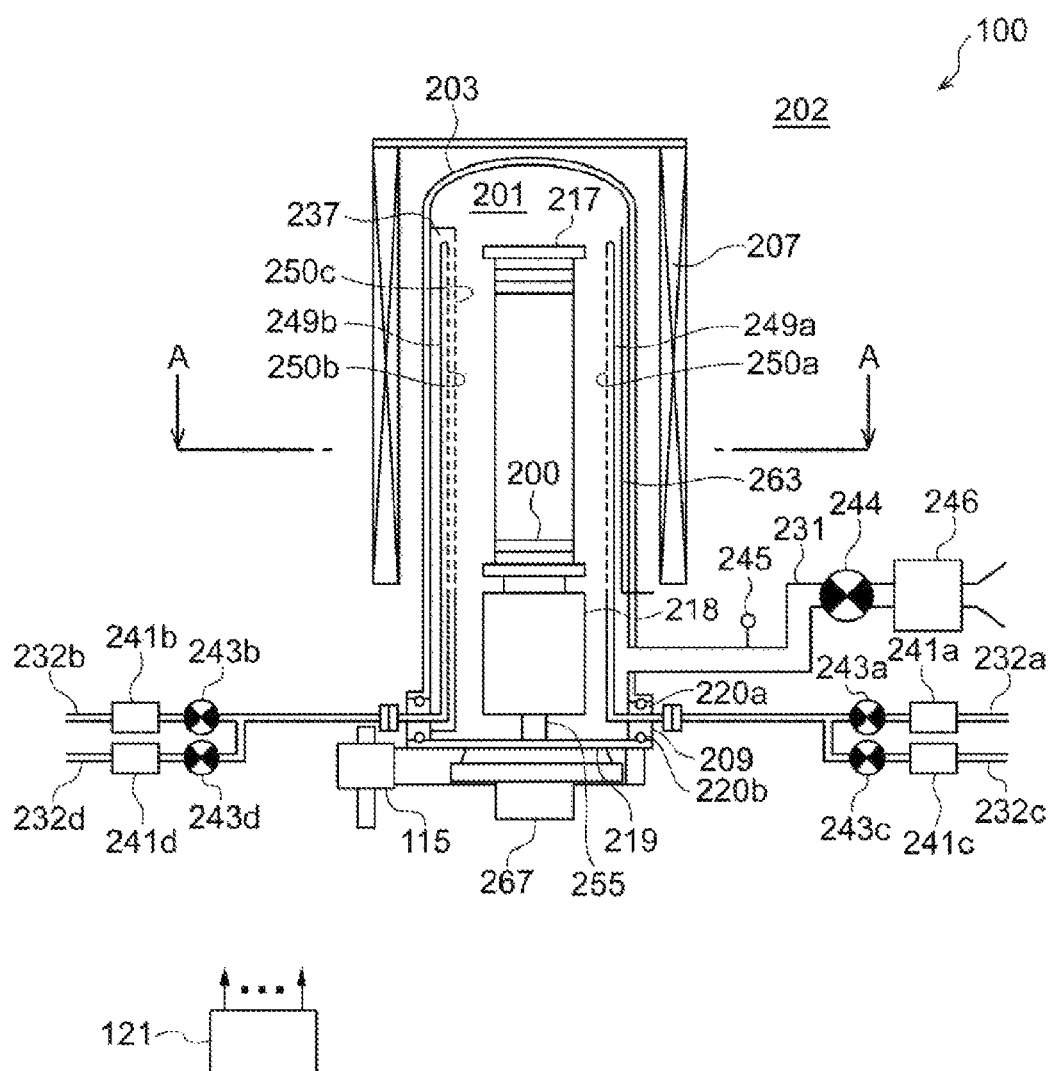
FIG. 2 is a schematic configuration view showing a substrate processing apparatus used in a method of manufacturing a semiconductor device, according to the embodiments of the present disclosure.

First, the substrate processing apparatus will be described with reference to FIG. 2. The substrate processing apparatus 100 illustrated in FIG. 2 shows a state where predetermined start-up steps such as assembling the substrate processing apparatus 100 including installing a reaction tube 203 cleaned by the above-describe cleaning method in a process furnace 202 and blank-baking the reaction tube are completed and wafers 200, which are mounted on a boat 217, are loaded into a process chamber 201. In the present disclosure, the reaction tube 203, which is simply referred to as a reaction tube, is a reaction tube cleaned by the above-described method of cleaning the reaction tube.

As illustrated in FIG. 2, the substrate processing apparatus 100 includes the process furnace 202, and a heater 207 as a heating part is disposed at the process furnace 202. The heater 207 has a cylindrical shape and is supported by a heater base (not shown) as a holding plate to be vertically installed.

The heater 207 also functions as an activation mechanism (excitation part) for activating (exciting) a gas with heat, as will be described later.

The reaction tube 203 is disposed inside the heater 207 to be concentric with the heater 207. The reaction tube 203 is made of, for example, a heat resistant material such as quartz ($SiO_2$), silicon carbide (SiC), or the like, and is formed in a cylindrical shape with its upper end closed and its lower end opened. A manifold 209 is disposed to be concentric with the reaction tube 203 under the reaction tube 203. The manifold 209 is made of, for example, a metal such as stainless steel (SUS: Steel Use Stainless) or the like, and is formed in a cylindrical shape with both of its upper and lower ends opened. The upper end portion of the manifold 209 engages with the lower end portion of the reaction tube 203 so as to support the reaction tube 203.

An O-ring 220a serving as a seal member is installed between the manifold 209 and the reaction tube 203. As the manifold 209 is supported by the heater base, the reaction tube 203 is in a state of being vertically installed. A processing vessel (reaction vessel) mainly includes the reaction tube 203 and the manifold 209. The process chamber 201 is formed in a hollow cylindrical portion of the processing vessel. The process chamber 201 is configured to accommodate a plurality of wafers 200 as substrates in a state of being arranged in multiple stages in the vertical direction in a horizontal posture by a boat (substrate holder) 217 to be described later.

In the process chamber 201, nozzles 249a (first nozzle) and 249b (second nozzle) extending in the vertical direction are installed so as to penetrate through a sidewall of the manifold 209. Gas supply pipes 232a and 232b are connected to the nozzles 249a and 249b, respectively. In this way, the two nozzles 249a and 249b and the two gas supply pipes 232a and 232b are installed in the reaction tube 203, whereby a plurality of types of gases, here two types of gases, can be supplies into the process chamber 201.

Mass flow controllers (MFCs) 241a and 241b, which are flow rate controllers (flow rate control parts), and valves 243a and 243b, which are opening/closing valves, are installed to the gas supply pipes 232a and 232b, respectively, sequentially from the upstream direction. Gas supply pipes 232c and 232d for supplying an inert gas are connected to the gas supply pipes 232a and 232b at downstream sides of the valves 243a and 243b, respectively. MFCs 241c and 241d, which are flow rate controllers, and valves 243c and 243d, which are opening/closing valves, are installed to the gas supply pipes 232c and 232d, respectively, sequentially from the upstream direction.

Figure 3:
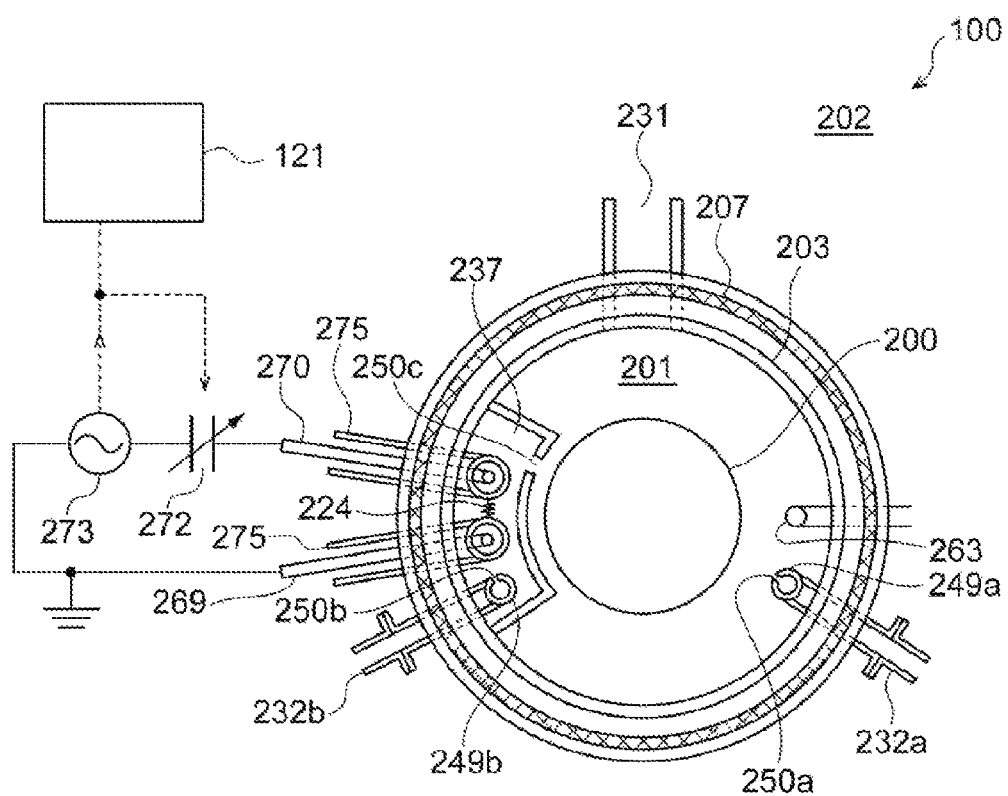
FIG. 3 is a sectional view taken along line A-A in FIG. 2, showing the substrate processing apparatus used in the method of manufacturing a semiconductor device, according to the embodiments of the present disclosure.

The nozzle 249a is connected to the leading end portion of the gas supply pipe 232a. As illustrated in FIG. 3, the nozzle 249a is disposed in an annular space between an inner wall of the reaction tube 203 and the wafers 200 so as to extend upward along a stack direction (vertical direction) of the wafers 200 from a lower portion of the inner wall of the reaction tube 203 to an upper portion thereof. Specifically, the nozzle 249a is installed in a region horizontally surrounding a wafer arrangement region in which the wafers 200 are arranged at a lateral side of the wafer arrangement region, along the wafer arrangement region. The nozzle 249a is configured as an L-shaped long nozzle and includes a horizontal portion provided so as to penetrate the sidewall of the manifold 209 and a vertical portion provided so as to extend upward from at least one end side of the wafer arrangement region to the other end side thereof. A gas supply hole 250a for supplying a gas is formed on the side surface of the nozzle 249a. The gas supply hole 250a is opened to face the center of the reaction tube 203 so that the gas can be supplied toward the wafers 200. A plurality of gas supply holes 250a are formed from the lower portion of the reaction tube 203 to the upper portion thereof. The plurality of gas supply holes 250a are formed to have the same aperture area at the same aperture pitch.

The nozzle 249b is connected to the leading end portion of the gas supply pipe 232b. The nozzle 249b is disposed in a buffer chamber 237, which is a gas dispersion space. As illustrated in FIG. 3, the buffer chamber 237 is disposed in the annular space between the inner wall of the reaction tube 203 and the wafers 200 and in a portion extending from the lower portion in the process chamber 201 to the upper portion therein along the stack direction of the wafers 200. Specifically, the buffer chamber 237 is disposed along the wafer arrangement region in a region horizontally surrounding the wafer arrangement region at the lateral side of the wafer arrangement region.

A gas supply hole 250c for supplying a gas is formed at the end portion of a wall of the buffer chamber 237 adjacent to the wafers 200. The gas supply hole 250c is opened to face the center of the reaction tube 203 so that the gas can be supplied toward the wafers 200. A plurality of gas supply holes 250c are formed from the lower portion of the reaction tube 203 to the upper portion thereof. The plurality of gas supply holes 250c are formed to have the same aperture area at the same aperture pitch.

The nozzle 249b is disposed at the end portion of the buffer chamber 237 opposite to the end portion where the gas supply hole 250c is formed, so as to extend upward along the stack (arrangement) direction of the wafers 200 from the lower portion of the inner wall of the reaction tube 203 to the upper portion thereof. Specifically, the nozzle 249b is disposed in a region horizontally surrounding the wafer arrangement region in which the wafers 200 are arranged at the lateral side of the wafer arrangement region, along the wafer arrangement region. Like the nozzle 249a, the nozzle 249b is also configured as an L-shaped long nozzle. A gas supply hole 250b for supplying a gas is formed on the side surface of the nozzle 249b in the same manner as the gas supply hole 250a.

By adjusting the aperture area and the aperture pitch of each of the gas supply holes 250b as described above from the upstream side to the downstream side, it is possible to eject a gas, with its flow rate almost the same but its flow velocity different, from each of the gas supply holes 250b. Then, by once introducing the gas ejected from each of the plurality of gas supply holes 250b into the buffer chamber 237, it is possible to make the difference in the flow velocity of the gas uniform in the buffer chamber 237.

The gas ejected from each of the plurality of gas supply holes 250b into the buffer chamber 237 is ejected into the process chamber 201 from the plurality of gas supply holes 250c after the particle velocity of the gas is relaxed in the buffer chamber 237. The gas ejected from each of the plurality of gas supply holes 250b into the buffer chamber 237 becomes a gas having a uniform flow rate and flow velocity when ejected from each of the gas supply holes 250c into the process chamber 201.

In this way, in the present embodiments, a gas is transferred via the nozzles 249a and 249b and the buffer chamber 237 disposed in an annular vertically-long space defined by the inner wall of the reaction tube 203 and the end portions of the plurality of stacked wafers 200, that is, in a cylindrical space.

Then, the gas is ejected into the process chamber 201 for the first time in the vicinity of the wafers 200 from the gas supply holes 250a to 250c opened in the nozzles 249a and 249b and the buffer chamber 237, respectively. Further, the main flow of the gas in the process chamber 201 is in a direction parallel to the surfaces of the wafers 200, that is, in a horizontal direction. The residual gas after reaction that flowed on the surfaces of the wafers 200 flows in the direction of an exhaust pipe 231 to be described later. However, the direction of the residual gas flow is appropriately specified depending on the position of an exhaust port.

A precursor containing a predetermined element, for example, a silicon-based precursor gas which is a precursor gas containing at least silicon (Si), is supplied from the gas supply pipe 232a into the process chamber 201 via the MFC 241a, the valve 243a, and the nozzle 249a.

The silicon-based precursor gas is a gaseous silicon-based precursor, for example, a gas obtained by vaporizing a silicon-based precursor that is in a liquid state under normal temperature and normal pressure, a silicon-based precursor that is in a gaseous state under normal temperature and normal pressure, or the like. That is, when the term "precursor" is used in the present disclosure, it may mean a "liquid precursor in a liquid state," a "precursor gas in a gaseous state," or both.

A reaction gas, for example, an ammonia ($NH_3$) gas which is a nitrogen-containing gas, is supplied from the gas supply pipe 232b into the process chamber 201 via the MFC 241b, the valve 243b, the gas supply pipe 232b, the nozzle 249b, and the buffer chamber 237.

An inert gas, for example, a nitrogen ($N_2$) gas, is supplied from the gas supply pipes 232c and 232d into the process chamber 201 via the MFC 241c and 241d, the valves 243c and 243d, the gas supply pipes 232a and 232b, the nozzles 249a and 249b, and the buffer chamber 237, respectively.

When the above-mentioned gases are flowed from the gas supply pipes, respectively, a precursor supply system for supplying a precursor containing a predetermined element, that is, a precursor gas supply system (for example, for example, a silicon-based precursor gas supply system), mainly includes the gas supply pipe 232a, the MFC 241a, and the valve 243a. The nozzle 249a may be included in the precursor gas supply system.

Further, a reaction gas supply system (for example, a nitrogen-containing gas supply system) for supplying a reaction gas mainly includes the gas supply pipe 232b, the MFC 241b, and the valve 243b. The nozzle 249b and the buffer chamber 237 may be included in the reaction gas supply system.

Further, an inert gas supply system mainly includes the gas supply pipes 232c and 232d, the MFCs 241c and 241d, and the valves 243c and 243d. The inert gas supply system can also be referred to as a purge gas supply system.

As illustrated in FIG. 3, two rod-shaped electrodes 269 and 270, which are made of a conductor and have an elongated structure, are disposed in the buffer chamber 237 along the stacking direction of the wafer 200 to extend from the lower portion of the reaction tube 203 to the upper portion thereof. Each of the rod-shaped electrodes 269 and 270 is disposed in parallel with the nozzle 249b. Each of the rod-shaped electrodes 269 and 270 is protected by being covered with an electrode protection tube 275 over a region extending from an upper portion to a lower portion. One of the rod-shaped electrodes 269 and 270 is connected to a high frequency power supply 273 via a matching device 272, and the other is connected to the ground which is the reference potential. By applying high frequency (RF) power between the rod-shaped electrodes 269 and 270 from the high frequency power supply 273 via the matching device 272, plasma is generated in a plasma generation region 224 between the rod-shaped electrodes 269 and 270. A plasma source as a plasma generator (plasma generation part) mainly includes the rod-shaped electrodes 269 and 270 and the electrode protection tube 275. The matching device 272 and the high frequency power supply 273 may be included in the plasma source. The plasma source functions as an activation mechanism (excitation part) that activates (excites) a gas into a plasma state, as will be described later.

The electrode protection tube 275 has a structure in which each of the rod-shaped electrodes 269 and 270 can be inserted in the buffer chamber 237 in a state of being isolated from the internal atmosphere of the buffer chamber 237. If the oxygen concentration in the electrode protection tube 275 is about the same as the oxygen concentration in the outside air (atmosphere), the rod-shaped electrodes 269 and 270 inserted in the electrode protection tube 275 will be oxidized by heat generated by the heater 207. The interior of the electrode protection tube 275 may be filled with an inert gas such as a nitrogen ($N_2$) gas, or the interior of the electrode protection tube 275 may be purged with an inert gas such as a nitrogen ($N_2$) gas by using an inert gas purge mechanism. By doing so, the oxygen concentration in the electrode protection tube 275 can be reduced, thereby preventing the oxidation of the rod-shaped electrodes 269 and 270.

As illustrated in FIGS. 2 and 3, an exhaust pipe 231 for exhausting the internal atmosphere of the process chamber 201 is connected to the reaction tube 203. One end of the exhaust pipe 231 is connected to an exhaust port at the lower end portion of the process chamber 201. Further, a vacuum pump 246 as an exhaust device is connected to the exhaust pipe 231 via a pressure sensor 245, which is a pressure detector (pressure detection part) for detecting an internal pressure of the process chamber 201, and an APC (auto pressure controller) valve 244, which is an exhaust valve (pressure adjustment part). The APC valve 244 is configured to perform or stop an exhaust operation in the process chamber 201 by opening or closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The vacuum pump 246 may be included in the exhaust system.

The exhaust pipe 231 is not limited to the case where it is disposed in the reaction tube 203, but may be disposed in the manifold 209 in the same manner as the nozzles 249a and 249b.

A seal cap 219, which serves as a furnace-opening cover configured to hermetically seal a lower end opening of the manifold 209, is installed under the manifold 209. The seal cap 219 is configured to contact the lower end of the manifold 209 from the lower side in the vertical direction. An O-ring 220b, which is a seal member making contact with the lower end of the manifold 209, is installed on an upper surface of the seal cap 219. A rotary shaft 255 of a rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured so as to load/unload the boat 217 into/out of the process chamber 201 by moving the seal cap 219 up and down. The boat elevator 115 is configured as a transfer device (transfer mechanism) which transfers the boat 217 and the wafers 200 supported by the boat 217 into/out of the process chamber 201.

The boat 217 serving as a substrate holder is configured to support a plurality of wafers 200, e.g., 25 to 200 wafers, in such a state that the wafers 200 are arranged in a horizontal posture and in multiple stages along a vertical direction with the centers of the wafers 200 aligned with one another. The boat 217 is made of a heat resistant material such as quartz or SiC. A heat-insulating member 218 made of a heat resistant material such as quartz or SiC is disposed in the lower portion of the boat 217 so that heat from the heater 207 is not easily transferred to the seal cap 219 side.

A temperature sensor 263 serving as a temperature detector is disposed in the process chamber 201. Based on temperature information detected by the temperature sensor 263, a degree of supplying electric power to the heater 207 is adjusted such that the interior of the process chamber 201 has a desired temperature distribution.

Figure 4:
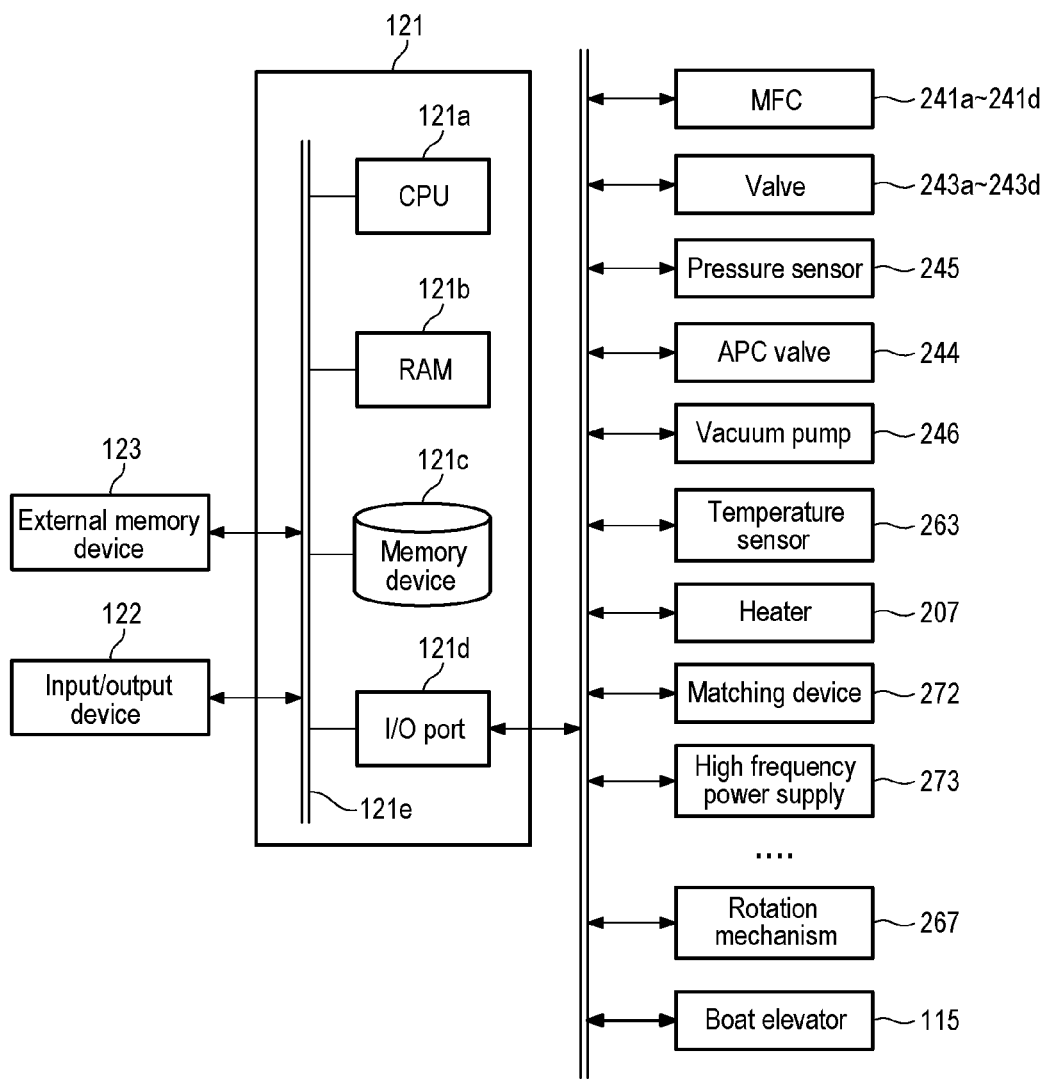
FIG. 4 is a block diagram for explaining a controller included in the substrate processing apparatus used in the method of manufacturing a semiconductor device, according to the embodiments of the present disclosure.

As illustrated in FIG. 4, a controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (hard disk drive), or the like. A control program for controlling operations of a substrate processing apparatus and a process recipe, in which sequences and conditions of substrate processing such as film formations to be described later are written, are readably stored in the memory device 121c. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the matching device 272, the high frequency power supply 273, and the like.

The CPU 121a is configured to read and execute the control program from the memory device 121c. The CPU 121a is also configured to read the recipe from the memory device 121c according to an input of an operation command from the input/output device 122. In addition, the CPU 121a is configured to control the flow-rate-adjusting operation of various kinds of gases by the MFCs 241a to 241d, the opening/closing operation of the valves 243a to 243d, the opening/closing operation of the APC valve 244, the pressure-adjusting operation performed by the APC valve 244 based on the pressure sensor 245, the actuating and stopping of the vacuum pump 246, the temperature-adjusting operation performed by the heater 207 based on the temperature sensor 263, the operation of adjusting the rotation and the rotation speed of the boat 217 by the rotation mechanism 267, the operation of moving the boat 217 up and down by the boat elevator 115, the impedance-adjusting operation by the matching device 272, the supply of power of the high frequency power supply 273, and the like, according to contents of the read recipe. The process recipe functions as a program for causing the controller 121 to execute each sequence in the substrate-processing process such as a film-forming process, which will be described later, to obtain an expected result.

The controller 121 is not limited to a case where it is configured as a dedicated computer, but may be configured as a general-purpose computer. For example, the controller 121 of the present embodiments may be configured by preparing an external memory device 123 (for example, a semiconductor memory such as a USB memory or a memory card) storing the aforementioned program and installing, on the general-purpose computer, the program by using the external memory device 123. However, a means for supplying the program to the computer is not limited to the case of supplying the program via the external memory device 123. For example, the program may be supplied to the computer by using communication means such as the Internet or a dedicated line, instead of using the external memory device 123. The memory device 121c and the external memory device 123 are configured as a non-transitory computer-readable recording medium.

Hereinafter, the memory device 121c and the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123.

[Substrate-Processing Process]

Next, as one step of a manufacturing process (manufacturing method) of a semiconductor device by using the above-described substrate processing apparatus 100, a film-forming sequence in which a film is formed (deposited) on a wafer 200 will be described in detail by way of an example. In the following description, the operations of various parts constituting the substrate processing apparatus 100 are controlled by the controller 121.

Here, an example of forming a film on the wafer 200 as a substrate by alternately supplying a first processing gas (a precursor gas forming a first layer) and a second processing gas (a reaction gas forming a second layer by modifying the first layer) to the wafer 200 will be described.

More specifically, an example of forming a silicon nitride film ($Si_3N_4$ film, hereinafter also referred to as a SiN film) on the wafer 200 by using a hexachlorodisilane ($Si_2Cl_6$, abbreviation: HCDS) gas (silicon-based precursor gas) as a precursor gas and an ammonia ($NH_3$) gas (nitrogen-containing gas) as a reaction gas will be described.

In the example of this film-forming sequence, the SiN film is formed on the wafer 200 by performing a cycle a predetermined number of times (one or more times), the cycle including non-simultaneously performing: a step of supplying a HCDS gas to the wafer 200 in the process chamber 201, a step of removing the HCDS gas (residual gas) from the process chamber 201, a step of supplying an $NH_3$ gas to the wafer 200, and a step of removing the $NH_3$ gas (residual gas) from the process chamber 201.

(Wafer Charging and Boat Loading)

When a plurality of wafers 200 are charged in (wafer charging) and held by the boat 217, the boat 217 is loaded into the process chamber 201 by the boat elevator 115 (boat loading). At this time, the seal cap 219 hermetically seals the lower end of the reaction tube 203 via the O-ring 220b.

(Pressure Adjustment and Temperature Adjustment)

The process chamber 201, that is, a space where the wafer 200 is placed, is vacuum-exhausted (decompression-exhausted) by the vacuum pump 246 to reach a desired pressure (vacuum degree). At this time, the internal pressure of the process chamber 201 is measured by the pressure sensor 245, and the APC valve 244 is feedback-controlled based on the measured pressure information. The vacuum pump 246 is always kept in operation at least until the processing to the wafer 200 is completed.

Further, the wafer 200 in the process chamber 201 is heated by the heater 207 so as to have a predetermined temperature. At this time, the degree of supplying electric power to the heater 207 is feedback-controlled based on the temperature information detected by the temperature sensor 263 so that the process chamber 201 has a predetermined temperature distribution. The heating in the process chamber 201 by the heater 207 is continuously performed at least until the processing to the wafers 200 is completed.

Further, the rotation of the boat 217 and the wafer 200 by the rotation mechanism 267 is started. The wafer 200 is rotated as the boat 217 is rotated by the rotation mechanism 267. The rotation of the boat 217 and the wafer 200 by the rotation mechanism 267 is continuously performed at least until the processing to the wafer 200 is completed.

(Film-Forming Process)

When the temperature in the process chamber 201 is stabilized at a preset processing temperature, the next precursor-gas-supplying step and reaction-gas-supplying step are sequentially executed.

In the precursor-gas-supplying step, a HCDS gas is supplied to the wafer 200 in the process chamber 201.

The valve 243a is opened to allow the HCDS gas to flow into the gas supply pipe 232a. The flow rate of the HCDS gas is adjusted by the MFC 241a, and the HCDS gas is supplied into the process chamber 201 via the nozzle 249a and is exhausted through the exhaust pipe 231. In this operation, the HCDS gas is supplied to the wafer 200.

At the same time, the valve 243d is opened to allow a $N_2$ gas to flow into the gas supply pipe 232d. The flow rate of the $N_2$ gas is adjusted by the MFC 241d, and the $N_2$ gas is supplied into the process chamber 201 together with the HCDS gas and is exhausted through the exhaust pipe 231.

By supplying the HCDS gas to the wafer 200, for example, a silicon (Si)-containing layer is formed as a first layer on the outermost surface of the wafer 200.

After the first layer is formed, the valve 243a is closed to stop the supply of the HCDS gas. At this time, with the APC valve 244 kept open, the interior of the process chamber 201 is vacuum-exhausted by the vacuum pump 246 to discharge the unreacted HCDS gas remaining in the process chamber 201 or the HCDS gas after contributing to the formation of the first layer from the process chamber 201. At this time, with the valve 243d kept open, the supply of the $N_2$ gas into the process chamber 201 is maintained. The $N_2$ gas acts as a purge gas, whereby the effect of discharging the gas remaining in the process chamber 201 from the process chamber 201 can be enhanced.

After the precursor-gas-supplying step is completed, an $NH_3$ gas is supplied to the first layer formed on the wafer 200. The $NH_3$ gas is activated with heat and is supplied to the wafer 200.

In the reaction-gas-supplying step, the opening/closing control of the valves 243b and 243c is performed in the same procedure as the opening/closing control of the valves 243a and 243d in the precursor-gas-supplying step.

The flow rate of the $NH_3$ gas is adjusted by the MFC 241b, and the $NH_3$ gas is supplied into the process chamber 201 via the nozzle 249b and is exhausted through the exhaust pipe 231. In this operation, the $NH_3$ gas is supplied to the wafer 200.

At the same time, the valve 243c is opened to allow a $N_2$ gas to flow into the gas supply pipe 232c. The flow rate of the $N_2$ gas is adjusted by the MFC 241c, and the $N_2$ gas is supplied into the process chamber 201 together with the $NH_3$ gas and is exhausted through the exhaust pipe 231.

The $NH_3$ gas supplied to the wafer 200 reacts with at least a portion of the first layer, that is, the Si-containing layer, formed on the wafer 200 in the precursor-gas-supplying step. As a result, the first layer is thermally-nitrided by non-plasma and is changed (modified) into a second layer, that is, a silicon nitride film (SiN film).

After the second layer is formed, the valve 243b is closed to stop the supply of the $NH_3$ gas. Then, the unreacted $NH_3$ gas, reaction by-products or the $NH_3$ gas after contributing to the formation of the second layer remaining in the process chamber 201 are discharged from the process chamber 201 according to the same processing procedure as the precursor-gas-supplying step.

At this time, the point that the gas or the like remaining in the process chamber 201 does not have to be completely discharged is the same as in the precursor-gas-supplying step.

[Performing Predetermined Number of Times]

By performing a cycle a predetermined number of times (n times), the cycle including non-simultaneously, that is, without synchronization, performing the above-described two steps, a SiN film having a predetermined film thickness can be formed on the wafer 200. The thickness of the second layer formed when the above cycle is performed once is made smaller than a predetermined film thickness, and the above cycle may be repeated a plurality of times until the film thickness of the SiN film formed by laminating second layers reaches a predetermined film thickness.

(Purging and Returning to Atmospheric Pressure)

After the film-forming process is completed, the valves 243c and 243d are opened to allow a $N_2$ gas to be supplied into the process chamber 201 from the gas supply pipes 232c and 232d, and the $N_2$ gas is exhausted through the exhaust pipe 231. The $N_2$ gas acts as a purge gas. Thus, the process chamber 201 is purged to remove a gas and reaction by-products remaining in the process chamber 201 from the process chamber 201 (purging). Thereafter, the atmosphere of the process chamber 201 is substituted with an inert gas (inert gas substitution), and the pressure of the process chamber 201 is returned to the atmospheric pressure (returning to atmospheric pressure).

(Boat Unloading and Wafer Discharging)

The seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). The processed wafers 200 are discharged from the boat 217 (wafer discharging).

In the above-described example of the film-forming sequence, the hexachlorodisilane ($Si_2Cl_6$) gas, which is a chlorosilane-based precursor gas, is used as the silicon-based precursor gas, but other chlorosilane-based precursor gas may be used, and further, an aminosilane-based precursor gas, a fluorosilane-based source gas, or the like may be used.

Further, as the precursor gas, instead of the silicon-based precursor gas, a titanium-based precursor (for example, titanium tetrachloride), a tantalum-based precursor (for example, tantalum pentachloride), a hafnium-based precursor (for example, tetrakisethylmethylaminohafnium), a zirconium-based precursor (for example, tetrakisethylmethyl-aminozirconium), an aluminum-based precursor (trimethylaluminum), or the like may be used.

Further, in the above-described example of the film-forming sequence, the SiN film is formed on the wafer 200 by using the $NH_3$ gas, which is a nitrogen-containing gas, as the reaction gas, but an $O_2$ gas or the like, which is an oxygen-containing gas, may be used as the reaction gas to form a SiO film on the wafer 200, or a $C_3H_6$ gas, which is a carbon-containing gas, may be used as the reaction gas to form a silicon carbide film (SiC film) on the wafer 200.

Further, in the above-described example of this film formation sequence, the SiN film is formed on the wafer 200, but other films may be formed. For example, a metal nitride film such as a titanium nitride film (TiN film) or a tantalum nitride film (TaN film) may be formed, or a metal oxide film such as a hafnium oxide film (HfO film), a zirconium oxide film (ZrO film), or an aluminum oxide film (AlO film) may be formed, or other insulating films such as a silicon oxide film may be formed.

Although a substrate processing apparatus used for semiconductor manufacturing has been described above for the substrate processing apparatus according to the present embodiments, the substrate processing apparatus according to the present embodiments is not limited to the application to this apparatus, but it can also be applied to an apparatus for processing a glass substrate used in manufacturing a LCD (liquid crystal display).

EXAMPLES

The present disclosure will be described in more detail below with Examples, but it goes without saying that these Examples are just illustrative and should not be construed in a limiting manner.

Example and Comparative Example

A quartz reaction tube was cleaned by using each step shown in Table 1 below.

Then, for the cleaned quartz reaction tube, the residual amount of fluorine atoms in the inner portion ("F amount" in Table 1), the amount of impurities introduced in the inner surface layer, and the surface roughness Ra of the inner surface were measured. The results are summarized in Table 1.

The residual amount of fluorine atoms in the inner portion was measured by the above-described method by using an ion electrode method. For the amount of impurities introduced in the inner surface layer of the reaction tube, the Na concentration at a depth of 5um in the inner surface layer was measured by the above-described method, which was used as an evaluation index. Further, the surface roughness Ra of the inner surface was measured by the measuring method prescribed in JIS B0601.

TABLE 1

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| First annealing step | ○ | ○ | ○ | ○ | ○ | ○ | ○ | ○ | ○ |
| First cleaning step | ○ | ○ | ○ | ○ | ○ | X | ○ | ○ | ○ |
| First rinsing step | ○ | ○ | ○ | ○ | ○ | X | ○ | — | ○ |
| (the number of times) | (two) | (two) | (two) | (one) | (four) |  | (two) |  | (two) |
| First rinse comparing step | — | — | — | — | — | — | — | ○ | — |
| (the number of times) |  |  |  |  |  |  |  | (one) |  |
| The number of repetitions of one cycle | two | two | two | one | ten | ten | two | fifteen | two |
| Second annealing step | ○ | ○ | ○ | ○ | ○ | X | ○ | X | ○ |
| Second cleaning step | ○ | ○ | ○ | ○ | ○ | ○ | ○ | X | ○ |
| Second rinsing step | ○ | ○ | ○ | ○ | ○ | ○ | ○ | X | — |
| (the number of times) | (two) | (seven) | (ten) | (two) | (ten) | (two) | (one) |  |  |
| Second rinse comparing step | — | — | — | — | — | — | — | — | ○ |
| (the number of times) |  |  |  |  |  |  |  |  | (one) |
| F amount of inner surface [mg/cm²] | 0.03 | 0.02 | 0.01 | 0.05 | <0.01 | 30 | >100 | 10 | >100 |
| Na concentration at 5 μm of inner surface layer [ppb] | <50 | <50 | <50 | <50 | <50 | 100 | <50 | 200 | <50 |
| Ra of inner surface in JIS B0601 [μm] | 0.1 | 0.1 | 0.1 | 0.1 | 0.8 | 0.8 | 0.1 | 1.2 | 0.1 |

The details of each step in Table 1 are as follows.

First annealing step: An electric furnace is used to perform annealing at 1,100 degrees C. for 1 hour in the air atmosphere.

First cleaning step: Hydrofluoric acid having a concentration of 5% by mass is used to perform cleaning for 10 minutes by an immersion method.

First rinsing step: The following specific rinsing step is performed a predetermined number of times.

As illustrated in FIG. 1, pure water is put into the container 10 and the reaction tube 20 lies down and immersed in the pure water (wetting step). Subsequently, the reaction tube 20 immersed in the pure water is rocked up, down, left and right for 30 seconds (rocking step). Subsequently, the reaction tube 20 immersed in the pure water is rotated in the circumferential direction (the direction of an arrow X in FIG. 1) of the reaction tube for 5 minutes (rotating step).

Number of repetitions of one cycle: One cycle including the first annealing step, the first cleaning step, and the first rinsing step is performed a predetermined number of times.

Second annealing step: An electric furnace is used to perform annealing at 1,080 degrees C. for 2 hours in the air atmosphere.

Second cleaning step: Hydrofluoric acid having a concentration of 25% by mass is used to perform cleaning for 30 minutes by an immersion method.

Second rinsing step: The specific rinsing step is performed a predetermined number of times.

First rinsing comparing step and second rinsing comparing step: The rinse cleaning is performed for 5 minute on the entire reaction tube by flushing with pure water.

As is clear from Table 1, in each Example, it can be seen that by using the method of cleaning the reaction tube according to the present embodiments, the residual amount of fluorine atoms in the inner portion is suppressed, and the amount of impurities introduced in the inner surface layer also suppressed.

As a result, it is considered that the reaction tube cleaned in each Example is less likely to be damaged even when applied to the substrate processing apparatus, which may extend the time (that is, life span) applicable to the substrate processing apparatus.

According to the present embodiments, even if a liquid having a high concentration of fluorine compound is used, the fluorine compound does not remain in the quartz reaction tube. For example, hydrogen fluoride (HF) is often used as the fluorine compound, but when this hydrogen fluoride remains in the inner portion of the quartz reaction tube, it reacts with $SiO_2$ constituting the quartz reaction tube to erode the quartz reaction tube and form precipitates such as hexafluorosilicic acid dihydrate ($H_2SiF_6 \cdot 2H_2O$). However, according to the present embodiments, such erosion of the quartz reaction tube can be suppressed.

Further, according to the present embodiments, even a case where there are many hydroxyl groups in the quartz reaction tube, even when the quartz reaction tube is heated during the substrate-processing process, the amount of fluorine atoms generated by reaction between the hydroxyl groups and precipitates (hexafluorosilicic acid dihydrate) can be reduced. As a result, the amount of fluorine atoms introduced in the surface layer of the inner surface of the quartz reaction tube can be reduced.

Further, according to the present embodiments, even if a chemical reaction occurs between a component such as a gas supplied to the interior of the reaction tube during the substrate-processing process and a component of the reaction tube, the gasification of fluorine atoms introduced in the surface layer can be reduced. As a result, erosion of the quartz reaction tube can be suppressed.

Conventionally, a cleaning gas containing fluorine atoms such as a $F_2$ gas increases the partial pressure of the already eroded portion, further erodes the eroded portion of the quartz reaction tube, increases damage of the quartz reaction tube, and shortens the life span of the reaction tube. However, according to the present embodiments, even if a cleaning gas including a fluorine compound is supplied, since fluorine atoms introduced in the surface layer of the cleaned reaction tube are suppressed to be extremely low, the erosion of the quartz reaction tube is reduced, which may extend the life span (for example, maintenance cycle) of the quartz reaction tube.

According to the present disclosure in some embodiments, it is possible to suppress the residue of a fluorine compound from remaining on the inner surface of a reaction tube even when cleaning is performed with a chemical solution containing the fluorine compound.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a reaction tube, comprising:
   a first annealing step of annealing the reaction tube;
   a first cleaning step of cleaning an inner surface of the reaction tube, after the first annealing step, with a liquid including a fluorine compound having a first concentration;
   a first rinsing step of washing away the fluorine compound used in the first cleaning step with pure water, wherein performing the first rinsing step one or more times is set to be a first cycle, and the first cycle is performed one or more times;
   a second annealing step of annealing the reaction tube;
   a second cleaning step of cleaning the inner surface of the reaction tube, after the second annealing step, with a liquid including a fluorine compound having a second concentration higher than the first concentration; and
   a second rinsing step of washing away the fluorine compound used in the second cleaning step with pure water,
   wherein the second rinsing step is performed two or more times, and
      wherein each of the first rinsing step and the second rinsing step includes:
      a wetting step of wetting the reaction tube by contacting with the pure water;
      a rocking step of rocking the reaction tube in contact with the pure water; and
      a rotating step of rotating the reaction tube in contact with the pure water in a circumferential direction of the reaction tube.

2. The method of claim 1, wherein a number of times that the second rinsing step is performed is equal to or greater than a number of times that the first rinsing step is performed.

3. The method of claim 1, wherein a number of times that the second rinsing step is performed is 7 or more.

4. The method of claim 1, further comprising at least one of an electrode and a gas nozzle installed in the reaction tube.

5. A method of manufacturing a semiconductor device, comprising:
- a cleaning step of cleaning a reaction tube, the cleaning step including:
  - a first annealing step of annealing the reaction tube;
  - a first cleaning step of cleaning an inner surface of the reaction tube, after the first annealing step, with a liquid including a fluorine compound having a first concentration;
  - a first rinsing step of washing away the fluorine compound used in the first cleaning step with pure water, wherein performing the first rinsing step one or more times is set to be a first cycle, and the first cycle is performed one or more times;
  - a second annealing step of annealing the reaction tube;
  - a second cleaning step of cleaning the inner surface of the reaction tube, after the second annealing step, with a liquid including a fluorine compound having a second concentration higher than the first concentration; and
  - a second rinsing step of washing away the fluorine compound used in the second cleaning step with pure water, the second rinsing step being performed two or more times;
- a substrate-processing step of accommodating one or more substrates in a process chamber installed inside the reaction tube; and processing the substrates, wherein each of the first rinsing step and the second rinsing step includes:
- a wetting step of wetting the reaction tube by contacting with the pure water;
- a rocking step of rocking the reaction tube in contact with the pure water; and
- a rotating step of rotating the reaction tube in contact with the pure water in a circumferential direction of the reaction tube.

6. The method of claim 5, wherein the substrate-processing step includes:
holding a plurality of substrates in a substrate holder; and
accommodating the substrate holder, which holds the plurality of substrates, in the reaction tube.

7. The method of claim 5, wherein the substrate-processing step includes:
processing the substrates with a first processing gas and a second processing gas supplied into the reaction tube.

8. The method of claim 5, wherein the substrate-processing step is performed by heating the one or more substrates accommodated in the reaction tube.

9. The method of claim 7, wherein the first processing gas is a precursor gas forming a first layer, and the second processing gas is a reaction gas forming a second layer by modifying the first layer.

* * * * *